US012637770B2

(12) United States Patent
Takenaka et al.

(10) Patent No.: US 12,637,770 B2
(45) Date of Patent: May 26, 2026

(54) DEPOSITION DEVICE AND DEPOSITION METHOD

(71) Applicant: Magnolia White Corporation, Tokyo (JP)

(72) Inventors: Takanobu Takenaka, Tokyo (JP); Atsushi Takeda, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 538 days.

(21) Appl. No.: 18/152,161

(22) Filed: Jan. 10, 2023

(65) Prior Publication Data

US 2023/0220548 A1     Jul. 13, 2023

(30) Foreign Application Priority Data

Jan. 12, 2022     (JP) ................................ 2022-003107

(51) Int. Cl.
| | |
|---|---|
| *C23C 16/455* | (2006.01) |
| *C23C 16/448* | (2006.01) |
| *H10K 50/10* | (2023.01) |
| *H10K 71/10* | (2023.01) |

(52) U.S. Cl.
CPC ...... *C23C 16/45563* (2013.01); *C23C 16/448* (2013.01); *H10K 50/10* (2023.02); *H10K 71/10* (2023.02)

(58) Field of Classification Search
None
See application file for complete search history.

(56) References Cited

U.S. PATENT DOCUMENTS

| | | |
|---|---|---|
| 2004/0160170 A1 | 8/2004 | Sato et al. |
| 2009/0009069 A1 | 1/2009 | Takata |
| 2013/0217158 A1 | 8/2013 | Lee |
| 2013/0337720 A1 | 12/2013 | Im et al. |
| 2019/0363275 A1 | 11/2019 | Ochi et al. |
| 2020/0123651 A1 | 4/2020 | Kim et al. |
| 2020/0176721 A1 | 6/2020 | Li |

FOREIGN PATENT DOCUMENTS

| | | |
|---|---|---|
| CN | 103255370 A | 8/2013 |
| CN | 109371368 A | 2/2019 |
| CN | 111684100 A | 9/2020 |
| JP | 2000-195677 A | 7/2000 |
| JP | 2004-207217 A | 7/2004 |
| JP | 2008-135325 A | 6/2008 |
| JP | 2009-32673 A | 2/2009 |

(Continued)

OTHER PUBLICATIONS

Office Action issued Apr. 3, 2025, in corresponding KR Application No. 10-2023-0002782, 10pp.

(Continued)

*Primary Examiner* — Anthony Ho
(74) *Attorney, Agent, or Firm* — XSENSUS LLP

(57) ABSTRACT

According to one embodiment, a deposition device includes a stage, a deposition head opposed to the stage, and a chamber accommodating the stage and the deposition head. The deposition head comprises a deposition source heating a material and generating vapor, a nozzle connected to the deposition source to emit the vapor generated by the deposition source, a control plate comprising a sleeve surrounding the nozzle, and a movement mechanism moving the control plate along an extension direction of the sleeve.

5 Claims, 9 Drawing Sheets

(56) References Cited

FOREIGN PATENT DOCUMENTS

| | | | |
|---|---|---|---|
| JP | 2010-118191 | A | 5/2010 |
| KR | 20130141188 | A | 12/2013 |
| KR | 101906358 | B1 | 10/2018 |
| KR | 20200045600 | A | 5/2020 |
| WO | 2018/179308 | A1 | 10/2018 |

OTHER PUBLICATIONS

Office Action issued Apr. 4, 2025, in corresponding CN Application No. 202310030010.9, 25pp.
Chinese Office Action issued Jun. 28, 2025, in corresponding CN Application No. 202310030010.9, 25pp (including English translation).
Japanese Office Action issued Sep. 16, 2025, in corresponding JP Application No. 2022-003107, 6pp (including English translation).
Chinese Office Action issued Sep. 30, 2025, in corresponding CN Application No. 202310030010.9, 15pp.

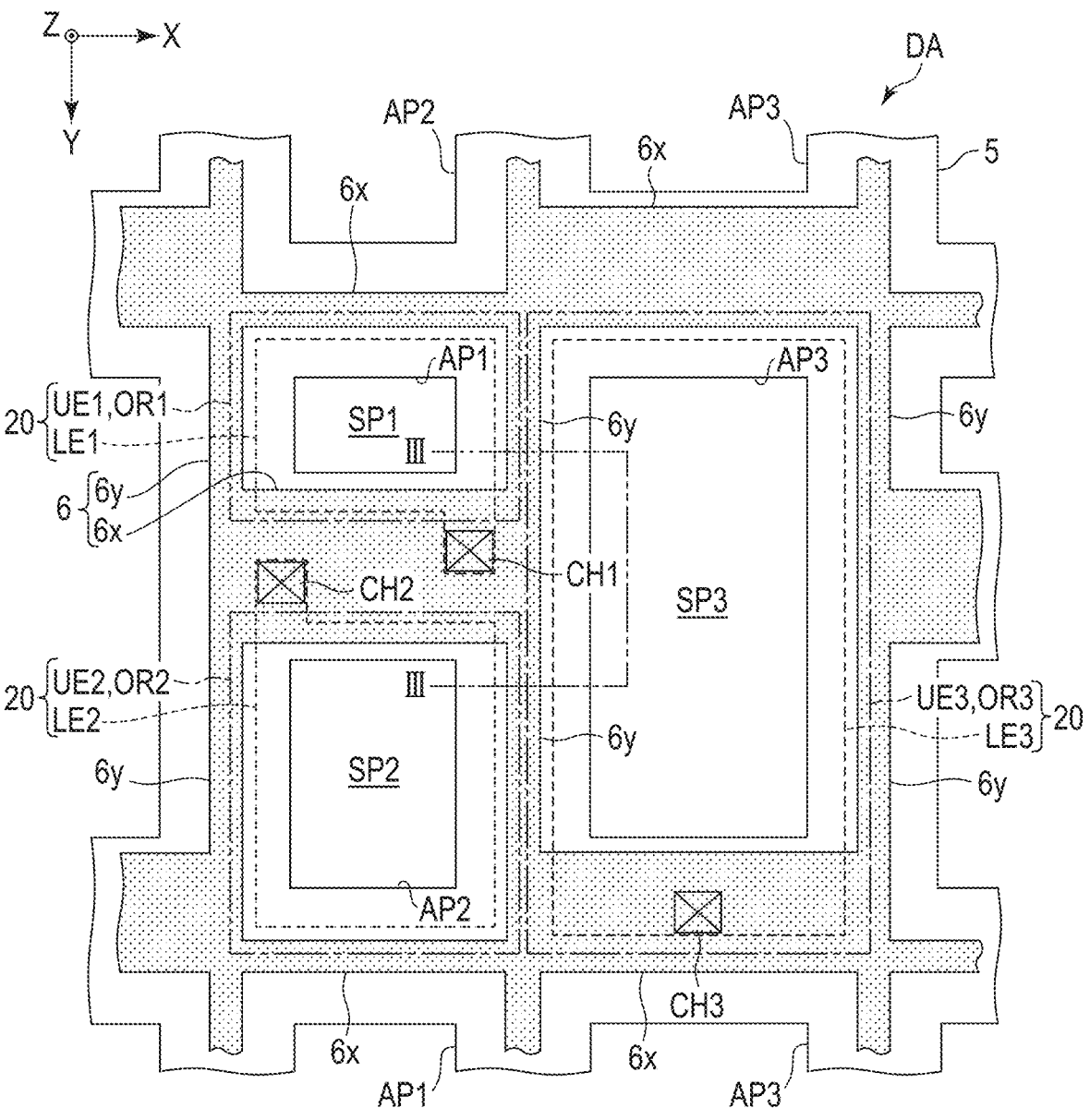
F I G. 2

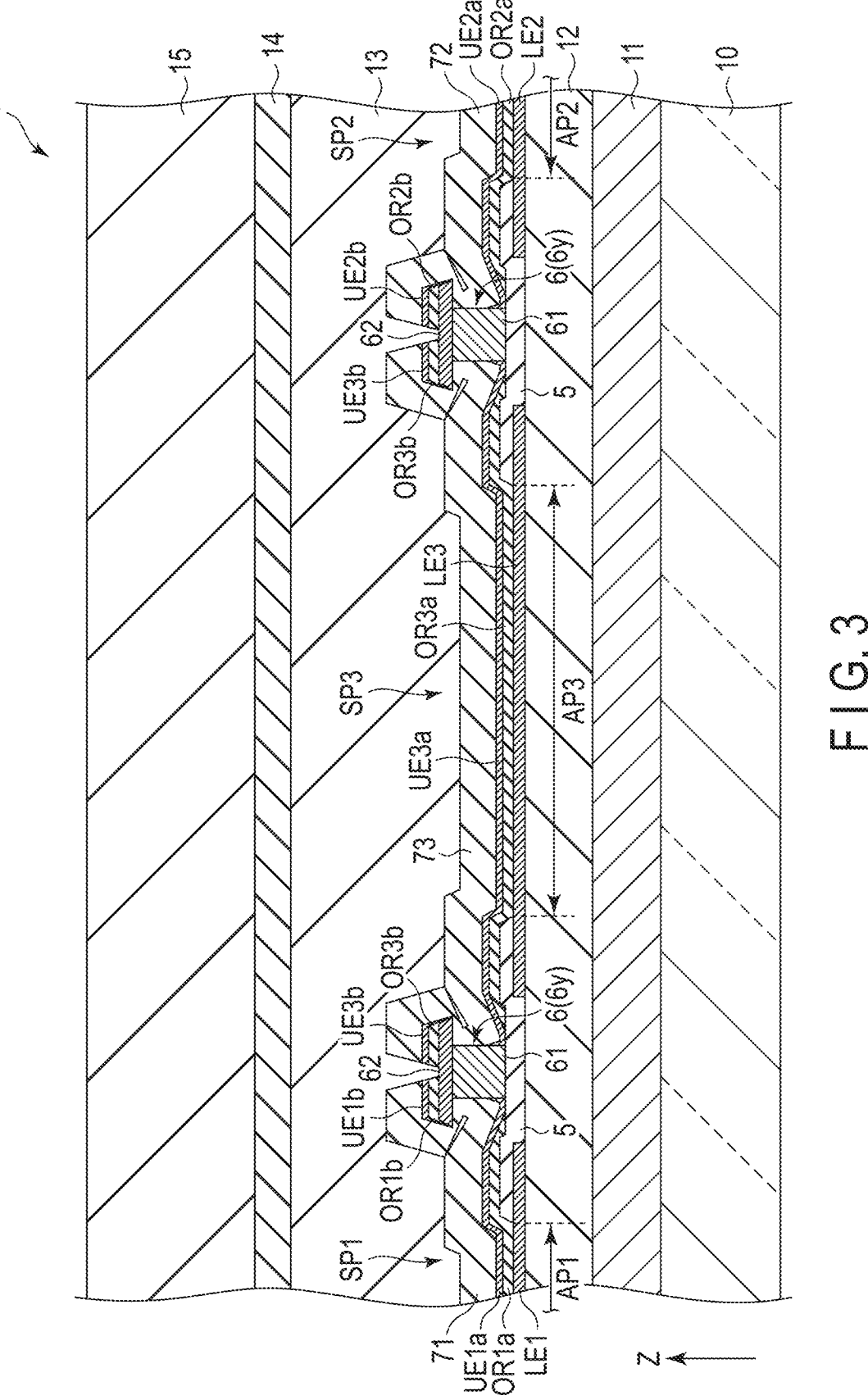
F I G. 3

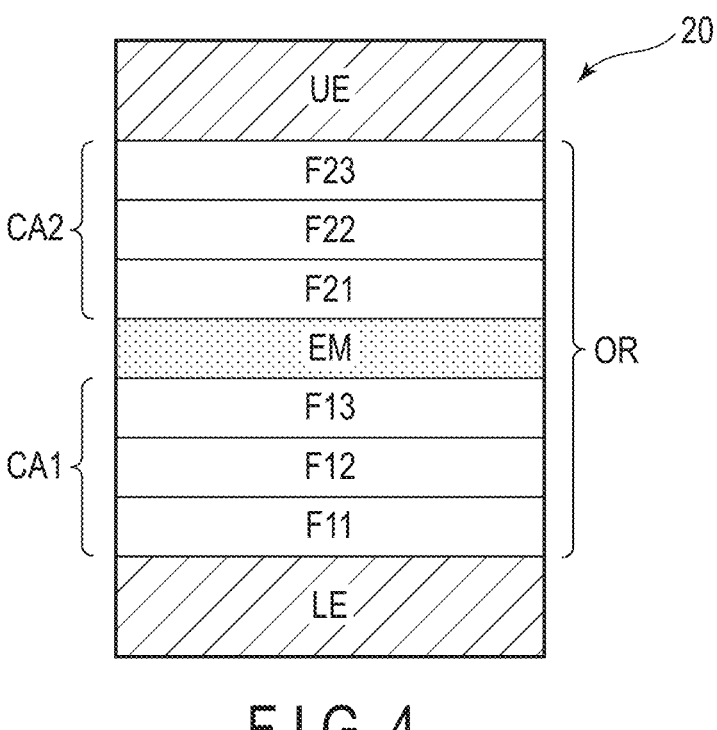
F I G. 4
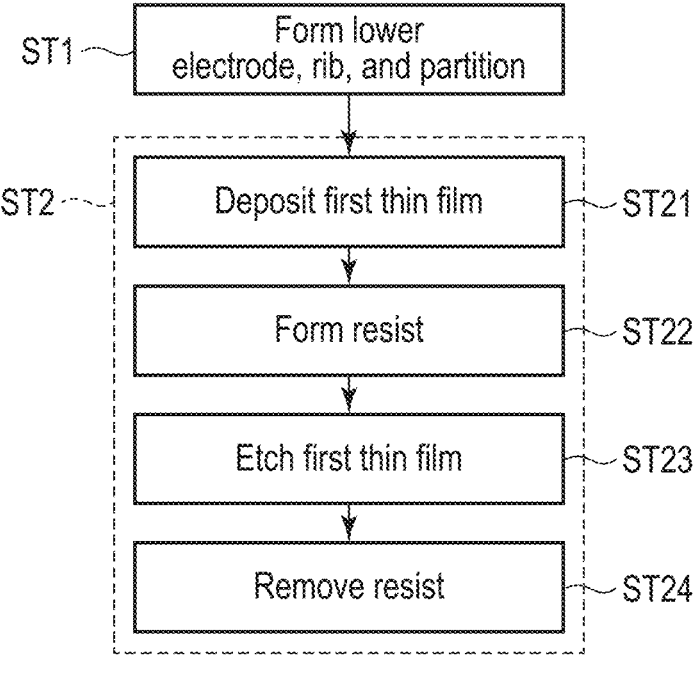
F I G. 5

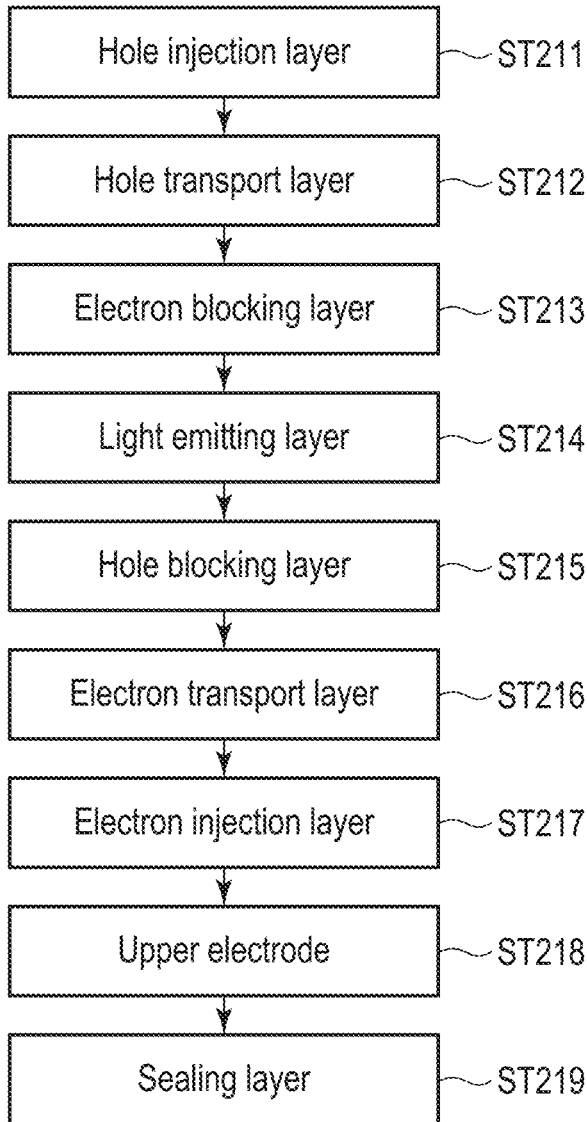
F I G. 6

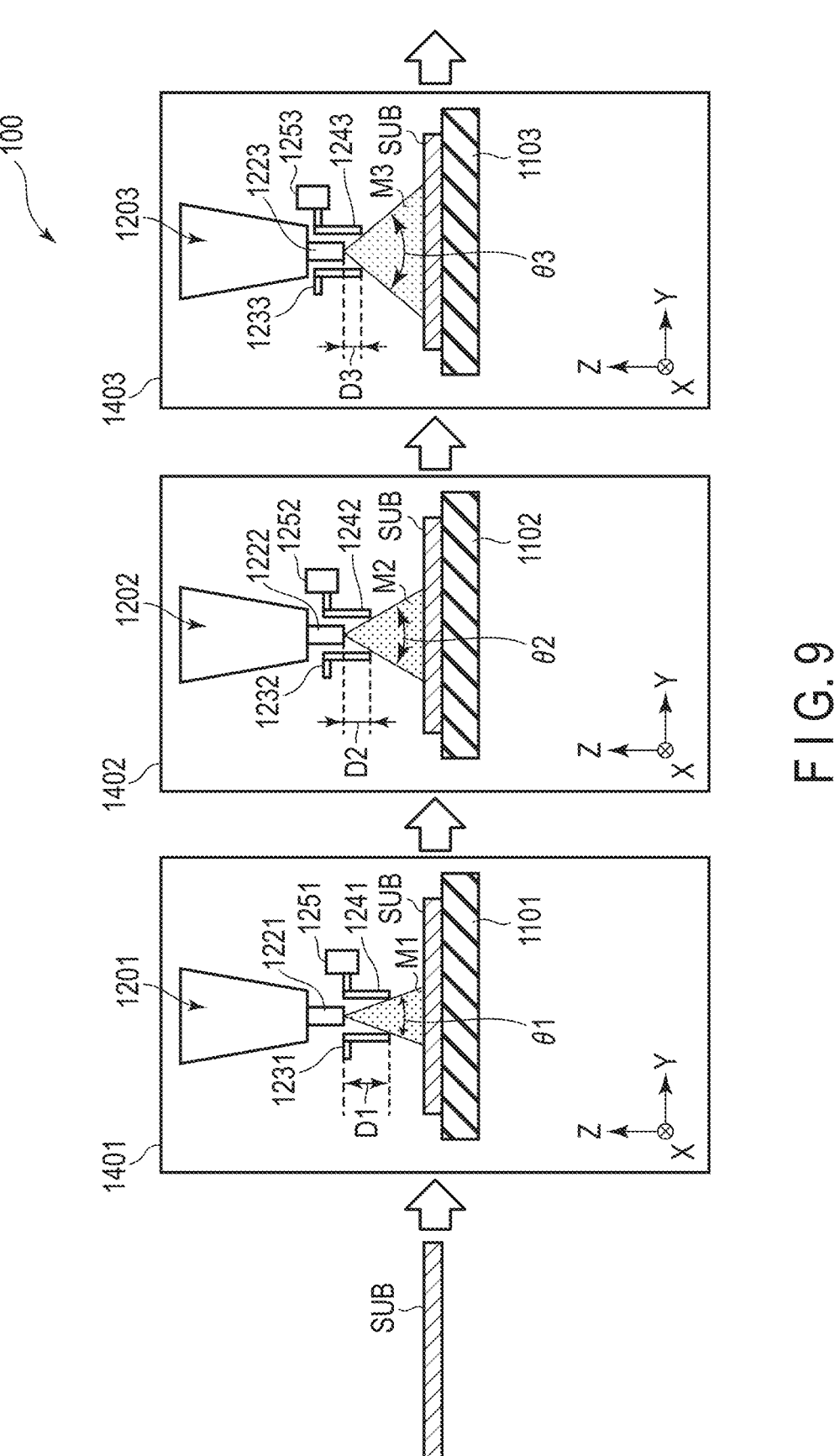
F I G. 9

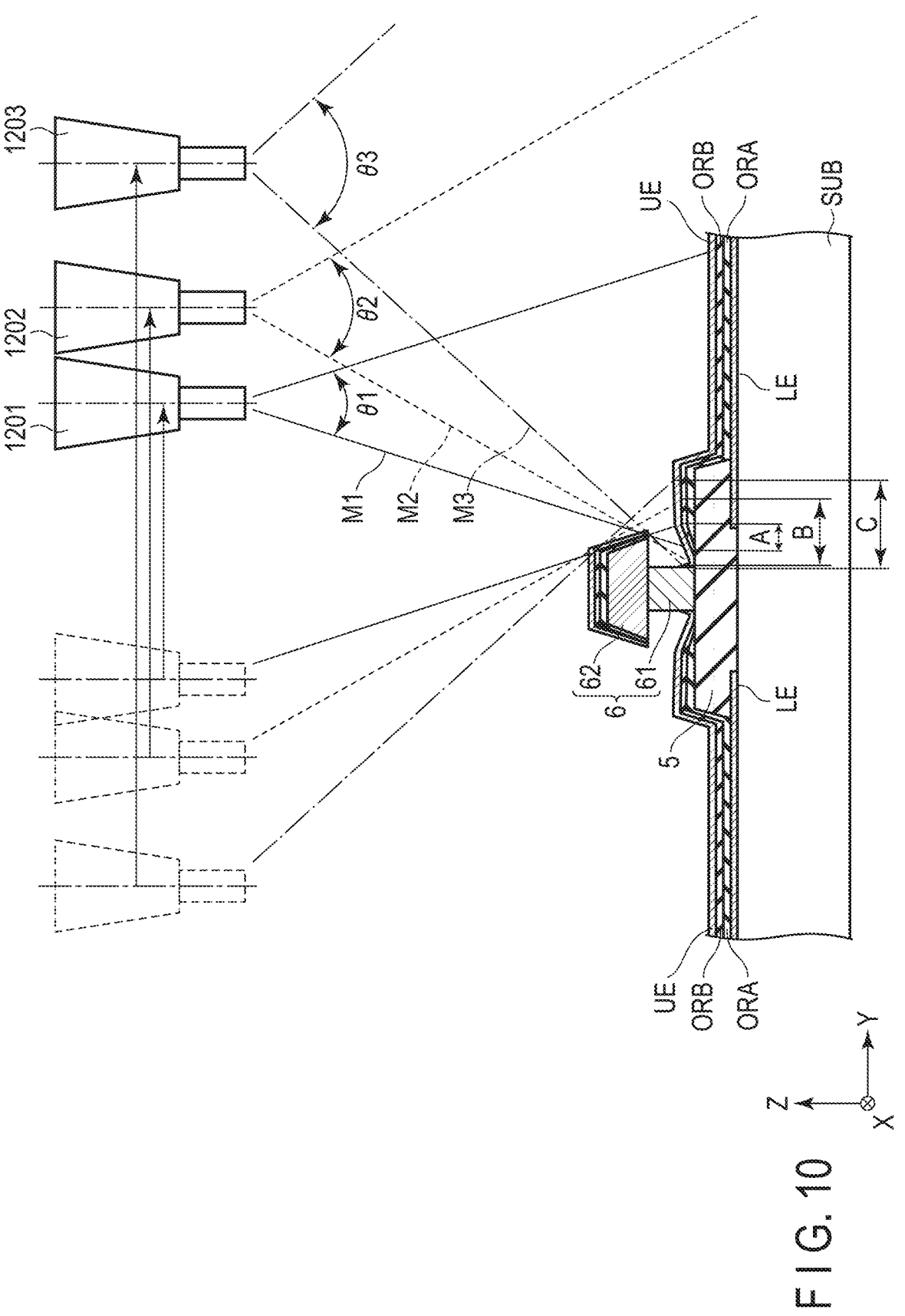
F I G. 10

DEPOSITION DEVICE AND DEPOSITION METHOD

CROSS-REFERENCE TO RELATED APPLICATIONS

This application is based upon and claims the benefit of priority from Japanese Patent Application No. 2022-003107, filed Jan. 12, 2022, the entire contents of which are incorporated herein by reference.

FIELD

Embodiments described herein relate generally to a deposition device and a deposition method.

BACKGROUND

Recently, display devices with organic light-emitting diodes (OLEDs) applied thereto as display elements have been put into practical use. This display device comprises a pixel circuit including a thin-film transistor, a lower electrode connected to the pixel circuit, an organic layer covering the lower electrode, and an upper electrode covering the organic layer. The organic layer includes functional layers such as a hole-transport layer and an electron-transport layer in addition to a light emitting layer.

For example, when the organic layer is deposited using a mask, a fine mask with an aperture corresponding to each pixel is applied. However, formation accuracy of a thin film formed by vapor deposition may be deteriorated due to processing accuracy of the fine mask, deformation of the aperture shape, and the like. For this reason, there is a need for a technology to form a thin film in a desired area without applying the fine mask.

BRIEF DESCRIPTION OF THE DRAWINGS

FIG. 2 is a view showing an example of a layout of the sub-pixels SP1, SP2, and SP3.

FIG. 3 is a schematic cross-sectional view showing the display device DSP taken along line III-III in FIG. 2.

FIG. 4 is a view showing an example of a configuration of the display device 20.

FIG. 5 is a view illustrating an example of a method of manufacturing the display device DSP.

FIG. 6 is a view illustrating the deposition process of the first thin film shown in FIG. 5.

FIG. 9 is a view showing an example of the deposition device and the deposition method according to the embodiment.

FIG. 10 is a view illustrating the deposition angle when depositing the first thin film.

DETAILED DESCRIPTION

Figure 1:
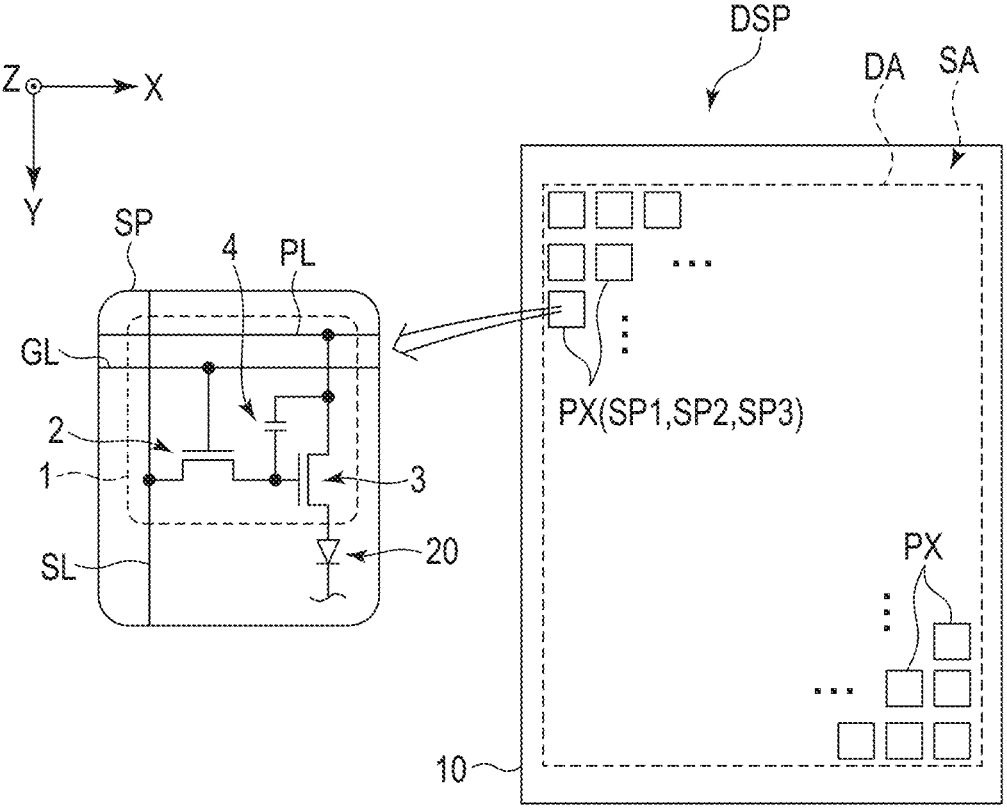
FIG. 1 is a view showing a configuration example of a display device DSP.

In general, according to one embodiment, a deposition device comprises: a stage; a deposition head opposed to the stage; and a chamber accommodating the stage and the deposition head. The deposition head comprises: a deposition source heating a material and generating vapor; a nozzle connected to the deposition source to emit the vapor generated by the deposition source; a control plate comprising a sleeve surrounding the nozzle; and a movement mechanism moving the control plate along an extension direction of the sleeve.

According to another embodiment, a deposition device comprises: a first deposition head configured to deposit a first material on a processing substrate; and a second deposition head configured to deposit a second material on the processing substrate on which the first material is deposited. Each of the first deposition head and the second deposition head comprises: a deposition source heating the material and generating vapor; a nozzle connected to the deposition source to emit the vapor generated by the deposition source; and a sleeve surrounding the nozzle and further extending to the processing substrate than a tip of the nozzle. A distance from the tip of the nozzle to a tip of the sleeve in the second deposition head is smaller than a distance from the tip of the nozzle to a tip of the sleeve in the first deposition head.

According to yet another embodiment, a deposition method comprises: preparing a processing substrate where a lower electrode, a rib including an aperture overlapping with the lower electrode, and a partition including a lower portion arranged on the rib and an upper portion arranged on the lower portion and protruding from a side surface of the lower portion are formed on a substrate; arranging a sleeve surrounding a nozzle of a first deposition head at a first position, emitting vapor of a first material from the first deposition head, and depositing the first material on the processing substrate; and arranging a sleeve surrounding a nozzle of a second deposition head at a second position farther from the processing substrate than the first position, emitting vapor of a second material from the second deposition head, and depositing the second material on the processing substrate on which the first material is deposited.

An embodiment will be described hereinafter with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. In addition, in the specification and drawings, structural elements which function in the same or a similar manner to those described in connection with preceding drawings are denoted by like reference numbers, detailed description thereof being omitted unless necessary.

In the figures, an X-axis, a Y-axis and a Z-axis orthogonal to each other are described to facilitate understanding as needed. A direction along the X-axis is referred to as a first direction, a direction along the Y-axis is referred to as a second direction, and a direction along the Z-axis is referred to as a third direction. Viewing various elements parallel to the third direction Z is referred to as planar view.

The display device of this embodiment is an organic electroluminescent display device comprising an organic light emitting diode (OLED) as a display element, and can be mounted on televisions, personal computers, vehicle-mounted devices, tablet terminals, smartphones, mobile phones, and the like.

FIG. 1 is a view showing a configuration example of a display device DSP.

The display device DSP has a display area DA where images are displayed and a surrounding area SA around the display area DA, on an insulating substrate 10. The substrate 10 may be glass or a flexible resin film.

In the embodiment, the shape of the substrate 10 in planar view is a rectangular shape. However, the shape of the substrate 10 in planar view is not limited to a rectangle, but may be any other shape such as a square, a circle or an ellipse.

The display area DA includes a plurality of pixels PX arrayed in a matrix in the first direction X and the second direction Y. Each of the pixels PX includes a plurality of sub-pixels SP. For example, the pixel PX comprises a red sub-pixel SP1, a green sub-pixel SP2, and a blue sub-pixel SP3. The pixel PX may include sub-pixels SP of other colors such as a white color together with the sub-pixels SP1, SP2, and SP3 or instead of any of the sub-pixels SP1, SP2, and SP3.

The sub-pixel SP comprises a pixel circuit 1 and a display element 20 driven by the pixel circuit 1. The pixel circuit 1 comprises a pixel switch 2, a drive transistor 3, and a capacitor 4. The pixel switch 2 and the drive transistor 3 are, for example, switching elements constituted by thin-film transistors.

A gate electrode of the pixel switch 2 is connected to a scanning line GL. One of a source electrode and a drain electrode of the pixel switch 2 is connected to a signal line SL, and the other is connected to a gate electrode of the drive transistor 3 and the capacitor 4. In the drive transistor 3, one of the source electrode and the drain electrode is connected to the power line PL and the capacitor 4, and the other is connected to an anode of a display element 20.

The configuration of the pixel circuit 1 is not limited to the example shown in the figure. For example, the pixel circuit 1 may comprise more thin-film transistors and capacitors.

The display element 20 is an organic light-emitting diode (OLED) as a light-emitting element and may be referred to as an organic EL element. For example, the sub-pixel SP1 comprises a display element 20 that emits light of a red wavelength range, the sub-pixels SP2 comprises a display element 20 that emits light of a green wavelength range, and the sub-pixels SP3 comprises a display element 20 that emits light of a blue wavelength range.

FIG. 2 is a view showing an example of a layout of the sub-pixels SP1, SP2, and SP3.

In the example of FIG. 2, the sub-pixels SP1 and SP2 are arranged in the second direction Y. Furthermore, each of the sub-pixels SP1 and SP2 is arranged with the sub-pixels SP3 in the first direction X.

When the sub-pixels SP1, SP2, and SP3 are arranged in such a layout, a column in which the sub-pixels SP1 and SP2 are alternately arranged in the second direction Y and a column in which a plurality of sub-pixels SP3 are arranged in the second direction Y are formed in the display area DA. These columns are alternately arranged in the first direction X.

The layout of the sub-pixels SP1, SP2, and SP3 is not limited to the example in FIG. 2. As another example, the sub-pixels SP1, SP2, and SP3 in each pixel PX may be arranged in order in the first direction X.

A rib 5 and a partition 6 are arranged in the display area DA. The rib 5 includes apertures AP1, AP2, and AP3 in the sub-pixels SP1, SP2, and SP3, respectively. In the example shown in FIG. 2, the aperture AP2 is larger than the aperture AP1, and the aperture AP3 is larger than the aperture AP2.

The partition 6 overlaps with the rib 5 in planar view. The partition 6 includes a plurality of first partitions 6*x* extending in the first direction X and a plurality of second partitions 6*y* extending in the second direction Y. The plurality of first partitions 6*x* are located between the apertures AP1 and AP2 adjacent in the second direction Y and between two apertures AP3 adjacent in the second direction Y. The second partitions 6*y* are located between the apertures AP1 and AP3 adjacent in the first direction X and between the apertures AP2 and AP3 adjacent in the first direction X.

In the example in FIG. 2, the first partitions 6*x* and the second partitions 6*y* are connected to each other. As a result, the partition 6 is formed to have a grating pattern surrounding the apertures AP1, AP2, and AP3 as a whole. The partition 6 is considered to include apertures at the sub-pixels SP1, SP2, and SP3, similarly to the rib 5.

The sub-pixel SP1 comprises a lower electrode LE1, an upper electrode UE1, and an organic layer OR1 each overlapping with the aperture AP1. The sub-pixel SP2 comprises a lower electrode LE2, an upper electrode UE2, and an organic layer OR2 each overlapping with the aperture AP2. The sub-pixel SP3 comprises a lower electrode LE3, an upper electrode UE3, and an organic layer OR3 each overlapping with the aperture AP3.

In the example in FIG. 2, outlines of the lower electrodes LE1, LE2, and LE3 are represented by dotted lines, and outlines of the organic layers OR1, OR2, and OR3 and the upper electrodes UE1, UE2, and UE3 are represented as one-dot chain lines. A peripheral portion of each of the lower electrodes LE1, LE2, and LE3 overlaps with the rib 5. The outline of the upper electrode UE1 almost matches the outline of the organic layer OR1, and the peripheral portions of the upper electrode UE1 and the organic layer OR1 overlap with the partition 6. The outline of the upper electrode UE2 almost matches the outline of the organic layer OR2, and the peripheral portions of the upper electrode UE2 and the organic layer OR2 overlap with the partition 6. The outline of the upper electrode UE3 almost matches the outline of the organic layer OR3, and the peripheral portions of the upper electrode UE3 and the organic layer OR3 overlap with the partition 6.

The lower electrode LE1, the upper electrode UE1, and the organic layer OR1 constitute the display element 20 of the sub-pixel SP1. The lower electrode LE2, the upper electrode UE2, and the organic layer OR2 constitute the display element 20 of the sub-pixel SP2. The lower electrode LE3, the upper electrode UE3, and the organic layer OR3 constitute the display element 20 of the sub-pixel SP3. For example, the lower electrodes LE1, LE2, and LE3 correspond to the anodes of the display elements 20. The upper electrodes UE1, UE2, and UE3 correspond to the cathodes of the display elements 20 or common electrodes.

The lower electrode LE1 is connected to the pixel circuit 1 of the sub-pixel SP1 (see FIG. 1) through a contact hole CH1. The lower electrode LE2 is connected to the pixel circuit 1 of the sub-pixel SP2 through a contact hole CH2. The lower electrode LE3 is connected to the pixel circuit 1 of the sub-pixel SP3 through the contact hole CH3.

FIG. 3 is a schematic cross-sectional view showing the display device DSP taken along line III-III in FIG. 2.

A circuit layer 11 is arranged on the substrate 10 described above. The circuit layer 11 includes various circuits such as the pixel circuits 1, and various lines such as the scanning lines GL, the signal lines SL and the power lines PL shown in FIG. 1. The circuit layer 11 is covered with an insulating layer 12. The insulating layer 12 functions as a planarization film for planarizing uneven parts generated by the circuit layer 11.

The lower electrodes LE1, LE2, and LE3 are arranged on the insulating layer 12. The rib 5 is arranged on the insulating layer 12 and the lower electrodes LE1, LE 2, and LE3. End portions of the lower electrodes LE1, LE2, and LE3 are covered with the rib 5.

The partition 6 includes a lower portion 61 arranged on the rib 5 and an upper portion 62 that covers an upper surface of the lower portion 61. The upper portion 62 has a width greater than the lower portion 61. As a result, both the end portions of the upper portion 62 protrude from the side surfaces of the lower portion 61 in FIG. 3. The shape of the partition 6 may also be referred to as an overhanging shape.

The organic layer OR1 shown in FIG. 2 includes a first organic layer OR1a and a second organic layer OR1b that are separated from each other. In addition, the upper electrode UE1 shown in FIG. 2 includes a first upper electrode UE1a and a second upper electrode UE1b that are separated from each other. As shown in FIG. 3, the first organic layer OR1a is in contact with the lower electrode LE1 through the aperture AP1, covers the lower electrode LE1 and partially covers the rib 5. The second organic layer OR1b is located on the upper portion 62. The first upper electrode UE1a is opposed to the lower electrode LE1 and covers the first organic layer OR1a. Furthermore, the first upper electrode UE1a is in contact with the side surface of the lower portion 61. The second upper electrode UE1b is located above this partition 6 and covers the second organic layer OR1b.

The organic layer OR2 shown in FIG. 2 includes a first organic layer OR2a and a second organic layer OR2b that are separated from each other. In addition, the upper electrode UE2 shown in FIG. 2 includes a first upper electrode UE2a and a second upper electrode UE2b that are separated from each other. As shown in FIG. 3, the first organic layer OR2a is in contact with the lower electrode LE2 through the aperture AP2, covers the lower electrode LE2 and partially covers the rib 5. The second organic layer OR2b is located on the upper portion 62. The first upper electrode UE2a is opposed to the lower electrode LE2 and covers the first organic layer OR2a. Furthermore, the first upper electrode UE2a is in contact with the side surface of the lower portion 61. The second upper electrode UE2b is located above the partition 6 and covers the second organic layer OR2b.

The organic layer OR3 shown in FIG. 2 includes a first organic layer OR3a and a second organic layer OR3b that are separated from each other. In addition, the upper electrode UE3 shown in FIG. 2 includes a first upper electrode UE3a and a second upper electrode UE3b that are separated from each other. As shown in FIG. 3, the first organic layer OR3a is in contact with the lower electrode LE3 through the aperture AP3, covers the lower electrode LE3 and partially covers the rib 5. The second organic layer OR3b is located on the upper portion 62. The first upper electrode UE3a is opposed to the lower electrode LE3 and covers the first organic layer OR3a. Furthermore, the first upper electrode UE3a is in contact with the side surface of the lower portion 61. The second upper electrode UE3b is located above the partition 6 and covers the second organic layer OR3b.

Sealing layers 71, 72, and 73 are arranged in the sub-pixels SP1, SP2, and SP3, respectively. The sealing layer 71 continuously covers the first upper electrode UE1a, the side surface of the lower portion 61, and the second upper electrode UE1b. The sealing layer 72 continuously covers the first upper electrode UE2a, the side surface of the lower portion 61, and the second upper electrode UE2b. The sealing layer 73 continuously covers the first upper electrode UE3a, the side surfaces of the lower portion 61, and the second upper electrode UE3b.

In the example in FIG. 3, the second organic layer OR1b, the second upper electrode UE1b, and the sealing layer 71 on the partition 6 between the sub-pixels SP1 and SP3 are separated from the second organic layer OR3b, the second upper electrode UE3b, and the sealing layer 73 on this partition 6. In addition, the second organic layer OR2b, the second upper electrode UE2b, and the sealing layer 72 on the partition 6 between the sub-pixels SP2 and SP3 are separated from the second organic layer OR3b, the second upper electrode UE3b, and the sealing layer 73 on this partition 6.

The sealing layers 71, 72, and 73 are covered with the resin layer 13. The resin layer 13 is covered with a sealing layer 14. Furthermore, the sealing layer 14 is covered with a resin layer 15.

The insulating layer 12 is formed of an organic material. The rib 5 and the sealing layers 14, 71, 72, and 73 are formed of, for example, an inorganic material such as silicon nitride (SiNx). The thickness of the rib 5 formed of an inorganic material is sufficiently small as compared to the thickness of the partition 6 and the insulating layer 12. In one example, the thickness of the rib 5 is 200 nm or more and 400 nm or less.

The lower portion 61 of the partition 6 is conductive. The upper portion 62 of the partition 6 may be conductive.

The lower electrodes LE1, LE2, and LE3 may be formed of a transparent conductive material such as ITO and may have a multilayer structure of a metallic material such as silver (Ag) and a transparent conductive material. The upper electrodes UE1, UE2, and UE3 are formed of, for example, a metallic material such as an alloy (MgAg) of magnesium and silver. The upper electrodes UE1, UE2, and UE3 may be formed of a transparent conductive material such as ITO.

When potentials of the lower electrodes LE1, LE2, and LE3 are relatively higher than those of the upper electrodes UE1, UE2, and UE3, the lower electrodes LE1, LE2, and LE3 correspond to anodes, and the upper electrodes UE1, UE2, and UE3 correspond to cathodes. In addition, when the potentials of the upper electrodes UE1, UE2, and UE3 are relatively higher than those of the lower electrodes LE1, LE2, and LE3, the upper electrodes UE1, UE2, and UE3 correspond to anodes, and the lower electrodes LE1, LE2, and LE3 correspond to cathodes.

Each of the organic layers OR1, OR2, and OR3 includes a plurality of functional layers and a light emitting layer.

The sub-pixels SP1, SP2, and SP3 may further include cap layers for adjusting the optical characteristics of the light emitted from the light emitting layers of the organic layers OR1, OR2, and OR3. Such a cap layer may be formed between the upper electrode UE1 and the sealing layer 71, between the upper electrode UE2 and the sealing layer 72, and between the upper electrode UE3 and the sealing layer 73.

A common voltage is supplied to the partition 6. This common voltage is supplied to each of the first upper electrodes UE1a, UE2a, and UE3a that are in contact with the side surfaces of the lower portion 61. A pixel voltage is supplied to the lower electrodes LE1, LE2, and LE3 through the pixel circuits 1 included in the respective sub-pixels SP1, SP2, and SP3.

When a potential difference is formed between the lower electrode LE1 and the upper electrode UE1, the light emitting layer of the first organic layer OR1a emits light of the red wavelength range. When a potential difference is formed between the lower electrode LE2 and the upper electrode UE2, the light emitting layer of the first organic layer OR2a emits light of the green wavelength range. When a potential difference is formed between the lower electrode LE3 and the upper electrode UE3, the light emitting layer of the first organic layer OR3a emits light of the blue wavelength range.

As another example, the light emitting layers of the organic layers OR1, OR2, and OR3 may emit light of the same color (for example, white). In this case, the display device DSP may comprise color filters that convert the light emitted from the light emitting layers into light of the colors corresponding to the sub-pixels SP1, SP2, and SP3. In addition, the display device DSP may comprise a layer including quantum dots that are excited by the light emitted from the light emitting layer and generate the light of the colors corresponding to the sub-pixels SP1, SP2, and SP3.

FIG. 4 is a view showing an example of a configuration of the display device 20.

The lower electrode LE shown in FIG. 4 corresponds to each of the lower electrodes LE1, LE2, and LE3 shown in FIG. 3. The organic layer OR shown in FIG. 4 corresponds to each of the organic layers OR1, OR2, and OR3 shown in FIG. 3. The upper electrode UE shown in FIG. 4 corresponds to each of the upper electrodes UE1, UE2, and UE3 shown in FIG. 3.

The organic layer OR includes a carrier adjustment layer CA1, a light emitting layer EM, and a carrier adjustment layer CA2. The carrier adjustment layer CA1 is located between the lower electrode LE and the light emitting layer EM, and the carrier adjustment layer CA2 is located between the light emitting layer EM and the upper electrode UE. The carrier adjustment layers CA1 and CA2 include a plurality of functional layers. An example where the lower electrode LE corresponds to the anode and the upper electrode UE corresponds to the cathode will be described below.

The carrier adjustment layer CA1 includes a hole-injection layer F11, a hole-transport layer F12, an electron blocking layer F13, and the like, as functional layers. The hole-injection layer F11 is arranged on the lower electrode LE, the hole-transport layer F12 is arranged on the hole-injection layer F11, the electron blocking layer F13 is arranged on the hole-transport layer F12, and the light emitting layer EM is arranged on the electron blocking layer F13.

The carrier adjustment layer CA2 includes a hole blocking layer F21, an electron-transport layer F22, an electron-injection layer F23, and the like, as functional layers. The hole blocking layer F21 is arranged on the light emitting layer EM, the electron-transport layer F22 is arranged on the hole blocking layer F21, the electron-injection layer F23 is arranged on the electron-transport layer F22, and the upper electrode UE is arranged on the electron-injection layer F23.

In addition to the functional layers described above, the carrier adjustment layers CA1 and CA2 may include the other functional layers such as a carrier generation layer as needed, and at least one of the above-described functional layers may be omitted.

FIG. 5 is a view illustrating an example of a method of manufacturing the display device DSP.

The manufacturing method illustrated here is roughly divided into a process of preparing a processing substrate which is to be a base for each of the sub-pixels SP1, SP2, and SP3 (step ST1), and a process of forming the first sub-pixel (step ST2). The first sub-pixel is any one of the sub-pixels SP1, SP2, and SP3.

First, in step ST1, a processing substrate SUB where the lower electrode LE, the rib 5 including the aperture AP overlapping with the lower electrode LE, and the partition 6 including a lower portion 61 disposed on the rib 5 and a upper portion 62 disposed on the lower portion 61 and protruding from the side surface of the lower portion 61, are formed on the substrate 10 is prepared.

Then, in step ST2, the first thin film is first deposited on the processing substrate SUB (step ST21). The deposition process of the first thin film will be described below. After that, a resist patterned in a predetermined shape is formed on the first thin film (step ST22). After that, the first thin film is etched using the resist as a mask (step ST23). After that, the resist is removed (step ST24). As a result, the first sub-pixel including the first thin film in the predetermined shape is formed.

FIG. 6 is a view illustrating the deposition process of the first thin film shown in FIG. 5. The first thin film described here includes the organic layer OR, the upper electrode UE, and the sealing layer 7. In addition, the organic layer OR includes a plurality of functional layers shown in FIG. 4.

First, materials to form the hole-injection layer F11 are deposited on the processing substrate SUB (step ST211). The hole-injection layer F11 in contact with the lower electrode LE is thereby formed. The lower electrode LE corresponds to any one of the above-described lower electrodes LE1, LE2, and LE3.

Then, materials to form the hole-transport layer F12 are deposited on the hole-injection layer F11 (step ST212). The hole-transport layer F12 in contact with the hole-injection layer F11 is thereby formed.

Then, materials to form the electron blocking layer F13 are deposited on the hole-transport layer F12 (step ST213). The electron blocking layer F13 in contact with the hole-transport layer F12 is thereby formed.

Then, materials to form the light emitting layer EM are deposited on the electron blocking layer F13 (step ST214). The light emitting layer EM in contact with the electron blocking layer F13 is thereby formed.

Then, materials to form the hole blocking layer F21 are deposited on the light emitting layer EM (step ST215). The hole blocking layer F21 in contact with the light emitting layer EM is thereby formed.

Then, materials to form the electron-transport layer F22 are deposited on the hole blocking layer F21 (step ST216). The electron-transport layer F22 in contact with the hole blocking layer F21 is thereby formed.

Then, materials to form the electron-injection layer F23 are deposited on the electron-transport layer F22 (step ST217). The electron-injection layer F23 in contact with the electron-transport layer F22 is thereby formed. The organic layer OR is formed by a series of processes from step ST211 to step ST217. The organic layer OR corresponds to any one of the above-described organic layers OR1, OR2, and OR3.

Then, materials to form the upper electrode UE are deposited on the electron-injection layer F23 (step ST218). As a result, the upper electrode UE which is in contact with the electron-injection layer F23 and the lower portion 61 of the partition 6 and which covers the organic layer OR is formed. The upper electrode UE corresponds to any one of the above-described upper electrodes UE1, UE2, and UE3.

Then, the sealing layer 7 covering the upper electrode UE and the partition 6 is formed (step ST219). The sealing layer 7 corresponds to any one of the above-described sealing layers 71, 72, and 73.

A transparent cap layer (optical adjustment layer) may be deposited before forming the sealing layer 7. In addition, at least one of steps ST211 to ST213 and at least one of steps ST215 to ST217 may be omitted. In addition, a process for forming the functional layers constituting the organic layer may be added besides steps ST211 to ST217.

Next, an example of a deposition device 100 applicable to the deposition process will be described.

Figure 7:
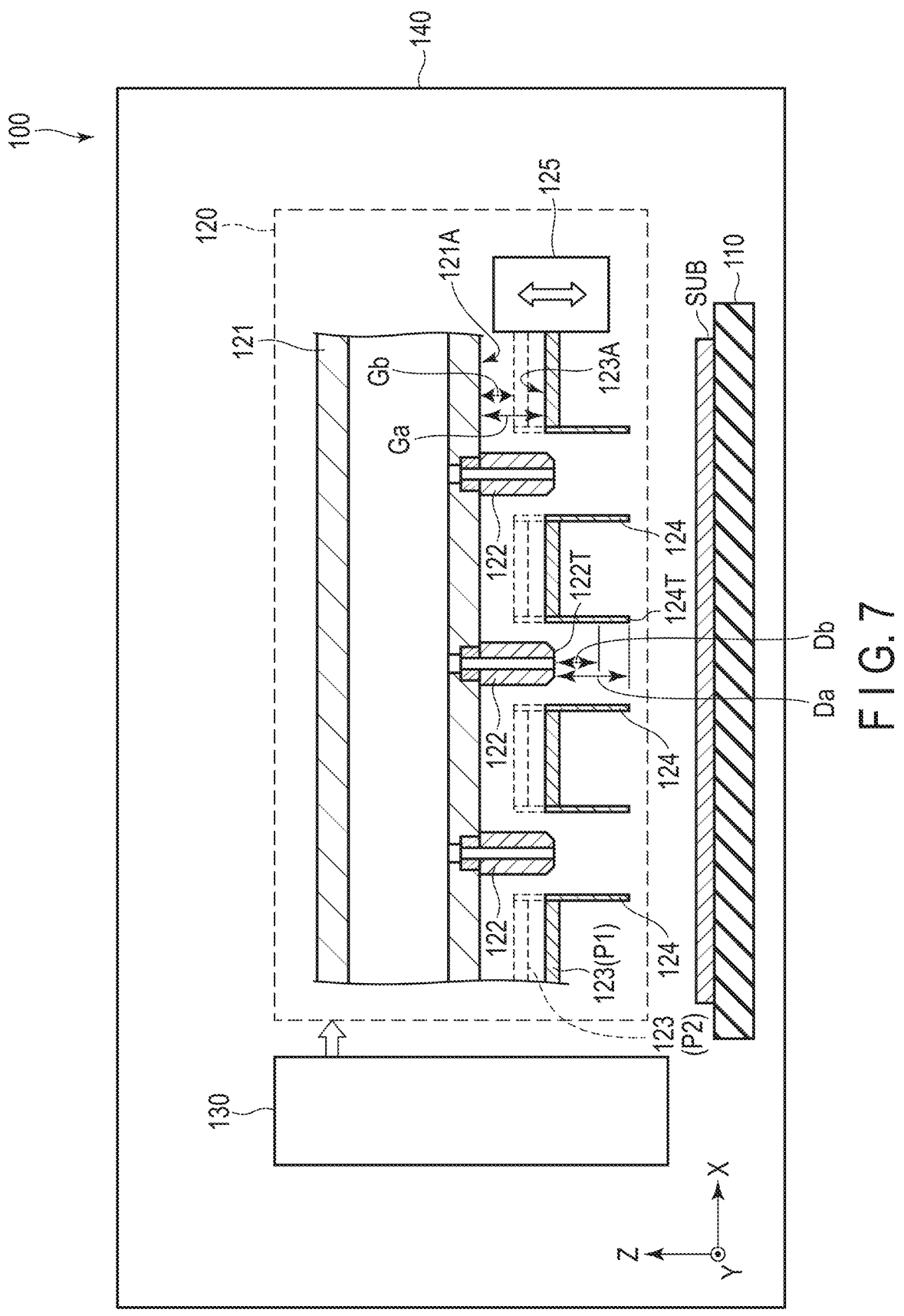
FIG. 7 is a view showing an example of the deposition device 100 according to the embodiment.

FIG. 7 is a view showing an example of the deposition device 100 according to the embodiment.

The deposition device 100 comprises a stage 110 on which the processing substrate SUB is arranged, a deposition head 120 opposed to the stage 110, a drive mechanism 130 that drives the deposition head 120, and a chamber 140. The chamber 140 accommodates the stage 110, the deposition head 120, the drive mechanism 130, and the like, and is configured such that the inside can be evacuated.

For example, when the sub-pixels SP1, SP2, and SP3 in the layout shown in FIG. 2 are formed, the deposition head 120 is opposed to the stage 110 in the third direction Z. The drive mechanism 130 comprises a scanning mechanism which moves the deposition head 120 emitting vapor, in the second direction Y, and a moving mechanism which moves the deposition head 120 in the first direction X.

The deposition head 120 comprises a deposition source 121, a plurality of nozzles 122, a control plate 123, and a moving mechanism 125.

The deposition source 121 is configured to heat a material and to generate vapor. The deposition source 121 has a bottom surface 121A on a side opposed to the stage 110 in the third direction Z. The material to be heated is a material for forming an organic layer or an upper electrode.

The plurality of nozzles 122 are aligned in the first direction X, are connected to the bottom surface 121A of the deposition source 121 and extend from the bottom surface 121A toward the stage 110 in the third direction Z. The plurality of nozzles 122 are configured to emit vapor generated in the deposition source 121 toward the stage 110 (or the processing substrate SUB on the stage 110).

The control plate 123 has an upper surface 123A opposed to the bottom surface 121A in the third direction Z. The control plate 123 comprises a plurality of sleeves 124. The plurality of sleeves 124 are formed to correspond to the plurality of nozzles 122, each of which extends toward the stage 110 in the third direction Z. Each of the sleeves 124 is arranged to surround the nozzle 122. These sleeves 124 regulate the vapor emitted from the deposition head 120 toward the processing substrate SUB. A spread angle of the vapor emitted from the deposition head 120 toward the processing substrate SUB through the sleeve 124 is hereinafter referred to as a deposition angle.

The moving mechanism 125 is configured to move the control plate 123 along an extension direction of the sleeves 124. In other words, the moving mechanism 125 can move the control plate 123 along the third direction Z, in the illustrated example.

For example, in a first mode (narrow deposition angle mode) in which the deposition angle of the vapor emitted from the deposition head 120 is a first angle, the moving mechanism 125 arranges the control plate 123 at a first position P1 represented by a solid line in FIG. 7. On the other hand, in a second mode (wide deposition angle mode) in which the deposition angle of the vapor emitted from the deposition head 120 is a second angle larger than the first angle, the moving mechanism 125 arranges the control plate 123 at a second position P2 represented by a dotted line in FIG. 7. The second position P2 is a position closer to the deposition source 121 than the first position P1. The moving mechanism 125 is not limited to the example shown in FIG. 7, but can arrange the control plate 123 at the other position different from the first position P1 and the second position P2.

A portion of the nozzle 122 that is closest to the stage 110 is referred to as a tip 122T of the nozzle 122, and a portion of the sleeve 124 that is closest to the stage 110 is referred to as a tip 124T of the sleeve 124. At this time, as regards a distance D from the tip 122T of the nozzle 122 to the tip 124T of the sleeve 124 along the third direction Z, a distance Db in the second mode is shorter than a distance Da in the first mode.

In addition, as regards a gap between the bottom surface 121A of the deposition source 121 and the upper surface 123A of the control plate 123 along the third direction Z, a gap Gb in the second mode is smaller than a gap Ga in the first mode.

The distance D and the gap G can be set freely by controlling the position of the control plate 123 by the moving mechanism 125. As the distance D or the gap G is larger, the vapor emitted from the nozzle 122 is further regulated by the sleeve 124, the linearity of the vapor is improved, and the deposition angle becomes smaller. As the distance D or the gap G is shorter, the vapor emitted from the nozzle 122 is less regulated by the sleeve 124, the diffusion of the vapor is improved, and the deposition angle becomes larger. Thus, the deposition angle of the vapor emitted from the deposition head 120 toward the processing substrate SUB can be freely controlled by controlling the position of the control plate 123.

Figure 8:
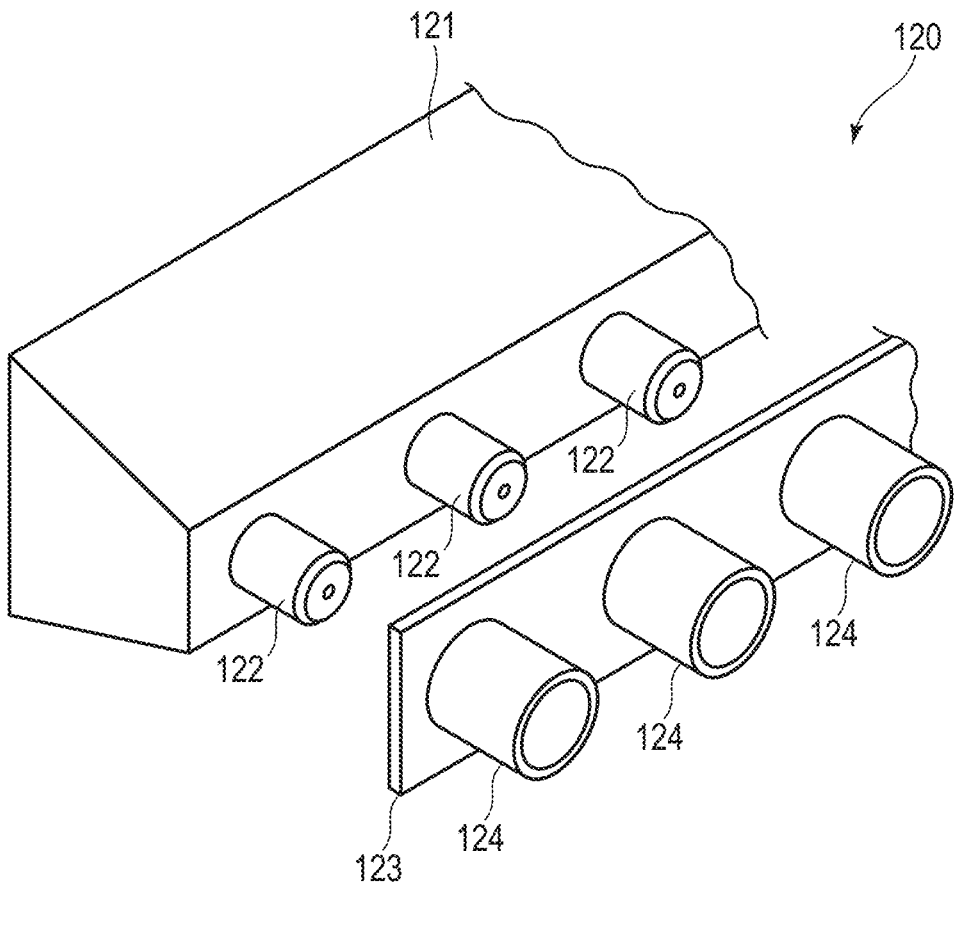
FIG. 8 is an exploded perspective view showing main parts of the deposition head 120.
Figure 8:
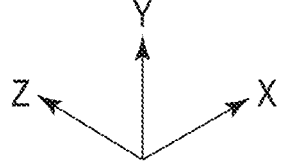

FIG. 8 is an exploded perspective view showing main parts of the deposition head 120.

In the deposition head 120, the nozzles 122 are formed in a cylindrical shape extending in the third direction Z. The plurality of nozzles 122 are arranged at regular pitches in the first direction X.

In the control plate 123, the sleeves 124 are formed in a cylindrical shape extending in the third direction Z. An inner diameter of the sleeve 124 is larger than an outer diameter of the nozzle 122. The plurality of sleeves 124 are arranged at regular pitches in the first direction X. The arrangement pitch of the sleeves 124 is equal to the arrangement pitch of the nozzles 122.

In the example shown in FIG. 8, the deposition head 120 comprises the nozzles 122 aligned in a row in the first direction X but are not limited to this example, and the deposition head 120 may comprise the nozzles 122 aligned in a plurality of rows. When the deposition head 120 comprises the nozzles 122 aligned in a plurality of rows, the control plate 123 comprises the sleeves 124 aligned in a plurality of rows.

FIG. 9 is a view showing an example of the deposition device and the deposition method according to the embodiment. A plurality of chambers and elements accommodated in the chambers shown here can be considered as one deposition device 100.

First, the processing substrate SUB is prepared. As described above, the processing substrate SUB is obtained by forming the lower electrode LE, the rib 5, and the partition 6 on the substrate 10.

Then, the processing substrate SUB is then introduced into a chamber 1401 and arranged on a stage 1101. A deposition head 1201 accommodated in the chamber 1401 is configured to deposit a material M1 on the processing substrate SUB. In the deposition head 1201, a control plate 1231 is moved by a moving mechanism 1251 under vacuum conditions, a sleeve 1241 is arranged at the first position, and an interval between a tip of a nozzle 1221 and a tip of the sleeve 1241 is set to a distance D1.

Then, the deposition head 1201 emits vapor of the material M1 toward the processing substrate SUB while moving in the second direction Y. At this time, part of the vapor emitted from the nozzle 1221 is blocked by the sleeve 1241. The deposition head 1201 emits the vapor of the material M1 at a deposition angle θ1. The material M1 is thereby deposited on the processing substrate SUB.

Then, the processing substrate SUB is introduced into a chamber 1402 and arranged on a stage 1102. The deposition head 1202 accommodated in the chamber 1402 is configured to deposit a material M2 on the processing substrate SUB on which the material M1 has been deposited. In the deposition head 1202, a control plate 1232 is moved by a moving mechanism 1252 under vacuum conditions, a sleeve 1242 is arranged at the second position which is farther from the processing substrate SUB than the first position, and an interval between a tip of a nozzle 1222 and a tip of the sleeve 1242 is set to a distance D2. The distance D2 is shorter than the distance D1.

Then, the deposition head 1202 emits vapor of the material M2 toward the processing substrate SUB while moving in the second direction Y. At this time, part of the vapor emitted from the nozzle 1222 is blocked by the sleeve 1242. The deposition head 1202 emits the vapor of the material M2 at a deposition angle θ2. The deposition angle θ2 is different from the deposition angle θ1, and is larger than the deposition angle θ1 in this example. The material M2 is thereby deposited on the processing substrate SUB. The material M2 is deposited over a wider range than the previously deposited material M1 to cover the material M1.

Then, the processing substrate SUB is introduced into a chamber 1403 and arranged on a stage 1103. A deposition head 1203 accommodated in the chamber 1403 is configured to deposit a material M3 on the processing substrate SUB on which the material M2 has been deposited. In the deposition head 1203, a control plate 1233 is moved by a moving mechanism 1253 under vacuum conditions, a sleeve 1243 is arranged at a third position which is farther from the processing substrate SUB than the second position, and an interval between a tip of a nozzle 1223 and a tip of the sleeve 1243 is set to a distance D3. The distance D3 is shorter than the distance D2.

Then, the deposition head 1203 emits vapor of the material M3 toward the processing substrate SUB while moving in the second direction Y. At this time, part of the vapor emitted from the nozzle 1223 is blocked by the sleeve 1243. The deposition head 1203 emits the vapor of the material M3 at a deposition angle θ3. The deposition angle θ3 is different from the deposition angles θ1 and θ2, and is larger than the deposition angles θ1 and θ2 in this example. The material M3 is thereby deposited on the processing substrate SUB. The material M3 is deposited over a wider range than the previously deposited material M2 to cover the material M2.

In the example shown in FIG. 9, the extension direction of the nozzle 1221 is parallel to the normal of the stage 1101, the extension direction of the nozzle 1222 is parallel to the normal of the stage 1102, and the extension direction of the nozzle 1223 is parallel to the normal of the stage 1103.

In addition, the distance from the stage 1101 to the nozzle 1221 along the third direction Z, the distance from the stage 1102 to the nozzle 1222 along the third direction Z, and the distance from the stage 1103 to the nozzle 1223 along the third direction Z are equal to each other, but may be different from each other.

FIG. 10 is a view illustrating the deposition angle when depositing the first thin film.

The figure shows lower layers ORA on sides close to the lower electrodes LE and upper layers ORB on sides close to the upper electrodes UE, among the organic layer OR including a plurality of functional layers and the light emitting layer. The lower layer ORA is, for example, the above-described hole-injection layer, hole-transport layer, light emitting layer, or the like. The upper layer ORB is, for example, the above-described electron-injection layer, electron-transport layer, hole blocking layer, or the like.

The deposition process with the deposition head 1201 corresponds to, for example, at least one process of steps ST211 to ST214 of the deposition process of the first thin film shown in FIG. 6.

The deposition head 1201 emits the vapor of the material M1 while moving in the second direction Y, and the lower layers ORA are thereby formed. At this time, part of the vapor emitted toward the partition 6 at the deposition angle θ1 is blocked by the upper portion 62. For this reason, the lower layers ORA adjacent in the second direction Y with the partition 6 interposed therebetween are divided by the partition 6 and are separated from the lower portion 61. In addition, the material M1 for forming the lower layers ORA is deposited on the upper portion 62 of the partition 6. The deposition angle θ1 represented by a solid line in the figure is, for example, 55° to 65°.

The deposition process with the deposition head 1202 corresponds to, for example, at least one process of steps ST215 to ST217 of the deposition process of the first thin film shown in FIG. 6.

The deposition head 1202 emits the vapor of the material M2 while moving in the second direction Y, and the upper layers ORB are thereby formed. At this time, part of the vapor emitted toward the partition 6 at the deposition angle θ2 is blocked by the upper portion 62. For this reason, the lower layers ORB adjacent in the second direction Y with the partition 6 interposed therebetween are divided by the partition 6 and are separated from the lower portion 61. In addition, the material M2 for forming the upper layers ORB is deposited on the upper portion 62 of the partition 6. Since the deposition angle θ2 is larger than the deposition angle θ1, the material M2 is deposited over a wider range than the material M1. For this reason, the material M2 is deposited in a range closer to the partition 6 than the material M1. Therefore, the lower layers ORA are covered with the upper layers ORB. The deposition angle θ2 represented by a dotted line in the figure is, for example, 95° to 105°.

The deposition process with the deposition head 1203 corresponds to, for example, a process of step ST218 of the deposition process of the first thin film shown in FIG. 6.

The deposition head 1203 emits the vapor of the material M3 while moving in the second direction Y, and the upper electrodes UE are thereby formed. At this time, the vapor emitted toward the partition 6 at a deposition angle θ3, which is larger than the deposition angle θ2, is blocked by the upper portion 62, but some of the vapor reaches the lower portion 61. For this reason, the upper electrodes UE adjacent in the second direction Y with the partition 6 interposed therebetween are divided by the partition 6 and are in contact with the lower portion 61. In addition, the material M3 for forming the upper electrodes UE is deposited on the upper portion 62 of the partition 6. Since the material M3 is deposited in a range closer to the partition 6 than the material M2, the upper layers ORB are covered with the upper electrodes UE. The deposition angle θ3 represented by a one-dot chain line in the figure is, for example, 115° to 125°.

On the rib 5, the lower layers ORA, the upper layers ORB, and the upper electrodes UE include portions A, B, and C, respectively, which are shaded by the partition 6 during deposition. These portions A, B, and C tend to be thinner than the portions overlapping with the lower electrodes LE, but do not contribute to light emission since they are separated from the lower electrodes LE. From the viewpoint of ensuring contact between the upper electrodes UE and the partition 6 and the viewpoint of restricting undesirable contact between the portions A and C, the above-described deposition angles θ1 to θ3 are desirably set such that each of the portions A, B, and C is formed on the rib 5.

As regards the widths of the portions A, B, and C along the second direction Y, the portion B is larger than the portion A, and the portion C is larger than the portion B. Then, the portion B covers the portion A, and the portion C covers the portion B. In addition, the portions A and B are spaced apart from the partition 6, and the portion C is in contact with the partition 6.

In the example described here, when the deposition head 1201 corresponds to the first deposition head, when the material M1 corresponds to the first material, and when the deposition angle θ1 corresponds to the first angle, then the deposition head 1202 or the deposition head 1203 corresponds to the second deposition head, the material M2 or the material M3 corresponds to the second material, and the deposition angle θ2 or the deposition angle θ3 corresponds to the second angle.

Alternatively, when the deposition head 1203 corresponds to the second deposition head, when the material M3 corresponds to the second material, and when the deposition angle θ3 corresponds to the second angle, then the deposition head 1201 or the deposition head 1202 corresponds to the first deposition head, the material M1 or the material M2 corresponds to the first material, and the deposition angle θ1 or the deposition angle θ2 corresponds to the first angle.

Alternatively, the deposition head 1201 may correspond to the first deposition head, the material M1 may correspond to the first material, the deposition angle θ1 may correspond to the first angle, the deposition head 1202 may correspond to the second deposition head, the material M2 may correspond to the second material, the deposition angle θ2 may correspond to the second angle, the deposition head 1203 may correspond to the third deposition head, the material M3 may correspond to the third material, and the deposition angle θ3 may correspond to the third angle.

For example, the material M1 is the material for forming the lower layer ORA of the organic layer OR, the material M2 is the material for forming the upper layer ORB of the organic layer OR, and the material M3 is the material for forming the upper electrodes UE.

Thus, according to the embodiment, the deposition head 120 comprises the function of controlling the deposition angles. For this reason, the optimal deposition angle can be achieved when depositing each layer. In addition, the position of the end portion of each layer can be shifted by controlling the deposition angles.

Furthermore, if the material adheres to the inner surface of the sleeve 124 during the deposition, the deposition angles may be changed. According to the embodiment, the deposition angles can be maintained constant by changing the position of the control plate 123 according to the amount of adhesion of the materials. Moreover, since the moving mechanism 125 is accommodated in the chamber 140, the position of the control plate 123 can be changed while maintaining a vacuum inside the chamber 140.

As described above, according to the embodiment, a deposition device and a deposition method capable of controlling the deposition angle can be provided.

All of the deposition devices and deposition methods that can be implemented by a person of ordinary skill in the art through arbitrary design changes to the deposition devices and deposition methods described above as embodiments of the present invention come within the scope of the present invention as long as they are in keeping with the spirit of the present invention.

Various types of the modified examples are easily conceivable within the category of the ideas of the present invention by a person of ordinary skill in the art and the modified examples are also considered to fall within the scope of the present invention. For example, additions, deletions or changes in design of the constituent elements or additions, omissions, or changes in condition of the processes arbitrarily conducted by a person of ordinary skill in the art, in the above embodiments, fall within the scope of the present invention as long as they are in keeping with the spirit of the present invention.

In addition, the other advantages of the aspects described in the embodiments, which are obvious from the descriptions of the present specification or which can be arbitrarily conceived by a person of ordinary skill in the art, are considered to be achievable by the present invention as a matter of course.

What is claimed is:

1. A deposition device comprising:
a first deposition head configured to deposit a first material on a processing substrate; and
a second deposition head configured to deposit a second material on the processing substrate on which the first material is deposited,
each of the first deposition head and the second deposition head comprising:
a deposition source heating the material and generating vapor;
a nozzle connected to the deposition source to emit the vapor generated by the deposition source; and
a sleeve surrounding the nozzle and further extending to the processing substrate than a tip of the nozzle,
a distance from the tip of the nozzle to a tip of the sleeve in the second deposition head being smaller than a distance from the tip of the nozzle to a tip of the sleeve in the first deposition head.

2. The deposition device of claim 1, wherein
a spread angle of the vapor of the second material emitted from the second deposition head is larger than a spread angle of the vapor of the first material emitted from the first deposition head.

3. The deposition device of claim 1, wherein
each of the first deposition head and the second deposition head further comprises a moving mechanism which moves a control plate comprising the sleeve along an extension direction of the sleeve.

4. The deposition device of claim 1, wherein
the first material is a material for forming a lower layer of an organic layer constituting an organic EL element, and
the second material is a material for forming an upper electrode of the organic layer constituting the organic EL element.

5. The deposition device of claim 1, wherein
the first material is a material for forming an organic layer constituting an organic EL element, and
the second material is a material for forming an upper electrode constituting the organic EL element.

* * * * *